(12) United States Patent
Teng et al.

(10) Patent No.: US 7,830,163 B2
(45) Date of Patent: Nov. 9, 2010

(54) TESTING CIRCUIT BOARD FOR TESTING DEVICES UNDER TEST

(75) Inventors: Cheng-Yung Teng, Taipei County (TW); Li-Jieu Hsu, Taipei (TW); Wei-Fen Chiang, Taipei (TW); Yung-Yu Wu, Yilan County (TW); Hung-Wei Chen, Taipei County (TW); Huei-Huang Chen, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 114 days.

(21) Appl. No.: 12/247,040

(22) Filed: Oct. 7, 2008

(65) Prior Publication Data

US 2009/0108859 A1    Apr. 30, 2009

(30) Foreign Application Priority Data

Oct. 30, 2007    (TW) ............................... 96218199 U

(51) Int. Cl.
*G01R 31/02*    (2006.01)
(52) U.S. Cl. .................................................... 324/755
(58) Field of Classification Search ........................ None
See application file for complete search history.

(56) References Cited

U.S. PATENT DOCUMENTS

| | | | | |
|---|---|---|---|---|
| 6,437,586 | B1 * | 8/2002 | Robinson | 324/755 |
| 6,798,228 | B2 * | 9/2004 | Cuevas | 324/755 |
| 7,706,999 | B2 * | 4/2010 | Teng et al. | 324/754 |
| 2008/0191730 | A1 * | 8/2008 | Teng et al. | 324/765 |
| 2008/0243409 | A1 * | 10/2008 | Teng et al. | 702/67 |
| 2009/0015288 | A1 * | 1/2009 | Teng et al. | 324/770 |
| 2009/0140746 | A1 * | 6/2009 | Teng et al. | 324/537 |
| 2009/0254296 | A1 * | 10/2009 | Teng et al. | 702/117 |

* cited by examiner

*Primary Examiner*—Jermele M Hollington
(74) *Attorney, Agent, or Firm*—Muncy, Geissler, Olds & Lowe, PLLC

(57) ABSTRACT

The invention discloses a testing circuit board for placing a device under test and further testing the device under test according to a plurality of testing signals generated by a tester. The testing circuit board includes a circuit board and a plurality of sets of sockets. The circuit board includes a plurality of connecting holes. The plurality of sets of sockets are located on a plurality of connecting holes and electrically connects to the device under test via a plurality of connecting interfaces for transferring the plurality of testing signals to test the device under test.

13 Claims, 3 Drawing Sheets

TESTING CIRCUIT BOARD FOR TESTING DEVICES UNDER TEST

CROSS REFERENCE TO RELATED APPLICATIONS

This application claims priority of Taiwanese Patent Application Serial No. 096218199, filed on Oct. 30, 2007, the entirety of which is incorporated by reference herein.

FIELD OF THE INVENTION

The present invention relates to a testing circuit board, and in particular relates to a testing circuit board to test an integrated circuit according to the testing signals from a tester.

BACKGROUND OF THE INVENTION

To ensure the quality of an integrated circuit (IC), generally manufacturers test each IC after fabrication, and decide whether the IC is qualified to be provided to buyers depending on the test result.

FIG. 1 is a schematic diagram of the traditional skill for testing mass produced ICs. In this testing process, a tester 10 is used to test a device under test (DUT) 22, and the DUT 22 can be an IC under test. For convenience, the DUT 22 is usually located on a DUT board 20. DUT board 20 can be design as a single board or two boards (for example: a reference board and a daughter board) connected each other when the user needed.

However, each tester 10 needs an exclusive DUT board 20 during the testing process, and the selection of the circuit of the DUT board 20 is based on each different DUT 22. Some basic testing connecting terminals are included in the DUT board 20 for testing, such as device power supply (DPS) terminals, relay control terminals, channel terminals, control-bit test (CBIT) terminals, and multi-use holes. The testing connecting terminals mentioned above are disposed disorderly around the DUT board 20, and therefore it is very difficult, time-consuming and labor-consuming to fabricate a DUT board 20. It is also cost-consuming, because of the exclusive circuitry on the DUT board 20 for each DUT 22.

BRIEF SUMMARY OF INVENTION

To solve the problems which traditional skills have, this invention is intended to provide a testing circuit board to enhance the convenience of chip testing and to reduce the cost of testing.

The embodiment of this invention discloses a testing circuit board to be put on a device under test (DUT), and to test the DUT according to the testing signals generated by a tester. The testing circuit board includes a circuit board, a plurality of sets of bases, which have a plurality of connecting holes. A plurality of sets of sockets are placed on the connecting holes, and electrically connected to the DUT via a plurality of connecting interfaces for transferring the testing signals to test the DUT.

DETAILED DESCRIPTION OF INVENTION

Figure 1:
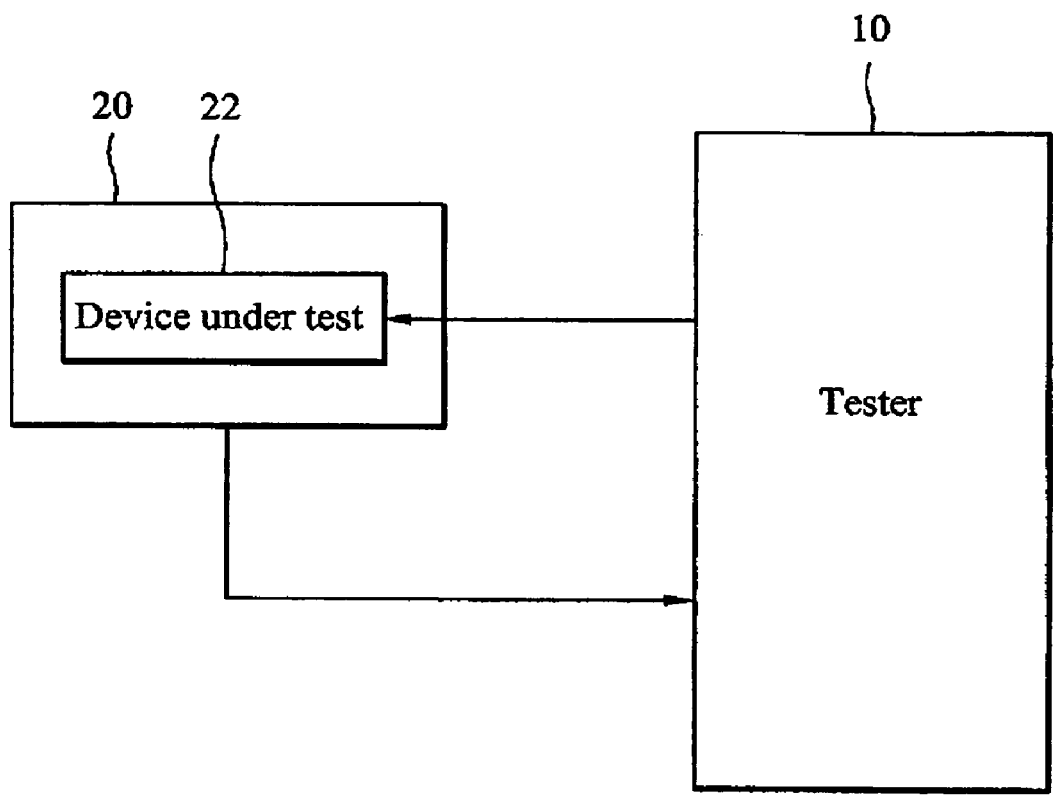
FIG. 1 is a schematic diagram of traditional skill for testing mass produced ICs.
Figure 2:
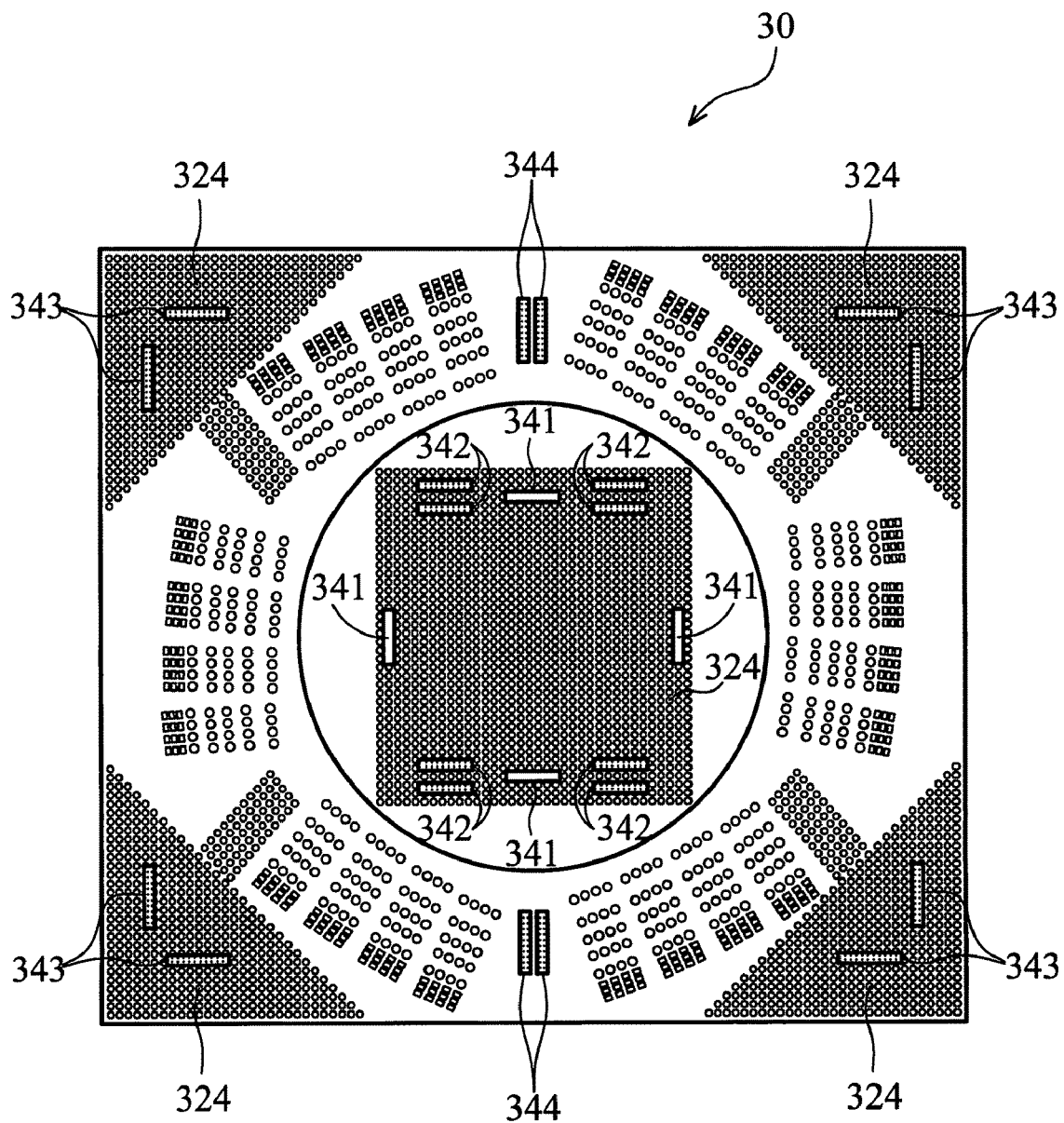
FIG. 2 is a schematic diagram showing the testing circuit board of the present invention.
Figure 3:
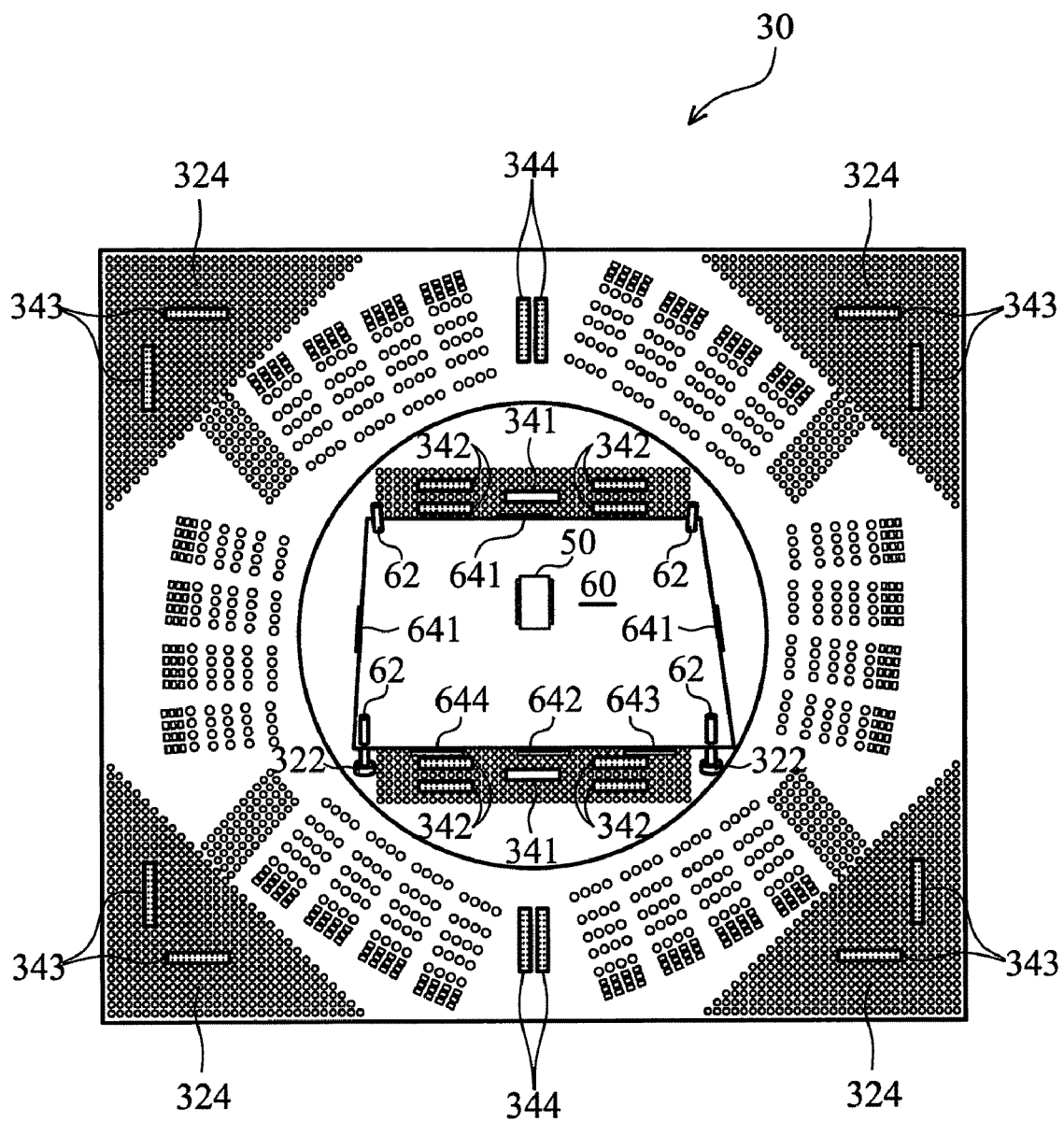
FIG. 3 is a schematic diagram showing another embodiment of the testing circuit board of the present invention.

FIG. 2 and FIG. 3 are schematic diagrams showing different embodiments of the testing circuit boards of the present invention. As FIG. 2 and FIG. 3 show, this invention discloses a testing circuit board 30, where a device under test (DUT) 50 is located on, and the DUT 50 is tested by a plurality of testing signals generated by a tester (not shown). In one embodiment, the DUT 50 is an integrated circuit (IC). The testing circuit board 30 includes a circuit board 32, with several connecting holes 324, and several sockets 341-344. In another embodiment, the circuit board 32 is a printed circuit board (PCB). Sockets 341-344 are located on the plurality of connecting holes 324, and electrically connected to the DUT 50 via several connecting interfaces (not shown) for transferring the testing signals to test the DUT 50. In another embodiment, a plurality connecting interfaces (not shown) are buses.

In a preferred embodiment, a load board 60, loading the DUT 50, is further located on the circuit board 32. Several latch holes (not shown) are correspondingly set on the load board 60 to a plurality latch bases 322 which are set on the circuit board 32. The load board 60 is locked on the circuit board 32 via the latch bases 322 and the latch holes (not shown). Meanwhile, in another embodiment, latch bases 322 and latch holes (not shown) are locked mutually via latch bars 62, by putting the latch bars 62 through the latch holes (not shown) of the load board 60 to the latch bases 322 of the circuit base 32 to lock the load board 60 on the circuit board 32.

Further, there are some sets of connecting slots 641-644, corresponding to sockets 341-344, on the load board 60. And the DUT 50 is electrically connected to the sockets 341-344 via the connecting slots 641-644 of the load board 60. In another embodiment, the connecting slots 641-644 of the load board 60 are electrically connected to the sockets 341-344 via the connecting interfaces (not shown).

A plurality of sets of sockets 341-344 include at least one set of power socket 341, which is connected to a power supply module (not shown), for the power supply module (not shown) to provide power, being transferred by the power socket 341, to the tester (not shown) to test the DUT 50. In another embodiment, a plurality of sets of sockets 341-344 include at least one set of a channel socket 342, for providing signal channels when the tester (not shown) is testing the DUT 50. Moreover, a plurality of sets of sockets 341-344 include at least one set of a controlling socket 343, for testing signals generated by the tester (not shown) comprising some controlling signals, and the controlling sockets 343 are used to transfer the controlling signals to test the DUT 50. The controlling signals generated by the tester (not shown) can control the DUT 50 for different tests. In another embodiment, at least one set of a controlling socket 343 is a set of a relay control terminal socket. In another embodiment, a plurality of sets of sockets 341-344 include at least one set of a control-bit test (CBIT) socket 344, and the testing signals include some CBIT testing signals, which are transferred by the CBIT socket 344 to test the DUT 50.

In each embodiment, the testing circuit boards of this invention are designed to be testing circuit boards suitable for various types of the DUTs, called reference boards. All the connecting slots, connected to the tester, are categorized and set on the testing circuit board, and then the categorized connecters are centralized to the corresponding bases. Thus, costs and time of fabrication are reduced by combining and using just one reference board (testing circuit board of this invention) with different correspondingly circuit carrying boards (also called daughterboards). All the embodiments of this invention have features such as testing time timesaving and testing efficiency enhancement, improving upon traditional skills.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A testing circuit board, for placing a device under test and further testing the device under test according a plurality of testing signals generated by a tester, comprising:
   a circuit board, with a plurality of connecting holes; and
   a plurality of sets of sockets, being located on the plurality of connecting holes, and electrically connected to the device under test via a plurality of connecting interfaces for transferring the plurality of testing signals to test the device under test;
   wherein the plurality of connecting interfaces are buses, respectively.

2. The testing circuit board as claimed in claim 1, wherein the circuit board is a printed circuit board (PCB).

3. The testing circuit board as claimed in claim 1, wherein a load board is located on the circuit board, to load the device under test.

4. The testing circuit board as claimed in claim 3, wherein the load board includes a plurality of latch holes, and the circuit board includes a plurality of latch bases, wherein the plurality of latch holes are set to correspond to the plurality of latch bases, and the load board is locked to the circuit board via the plurality of latch holes and the plurality of latch bases.

5. The testing circuit board as claimed in claim 4, wherein the plurality of latch bases and the plurality of latch holes are mutually locked via a plurality of latch bars.

6. The testing circuit board as claimed in claim 3, wherein the load board includes a plurality of sets of connecting slots, which are set corresponding to the plurality of sets of sockets, and the device under test is connected to the plurality of sets of sockets via the plurality of sets of connecting slots of the load board.

7. The testing circuit board as claimed in claim 6, wherein the plurality of sets of connecting slots of the load board is connected to the plurality of sets of sockets via the plurality of connecting interfaces.

8. The testing circuit board as claimed in claim 1, wherein the device under test is an Integrated Circuit (IC).

9. The testing circuit board as claimed in claim 7, wherein the plurality of sets of sockets include at least one power socket, which is coupled to a power supply module, and the power supply module provides power while the tester is testing the device under test, wherein at least one of the power sockets is used for transferring the power.

10. The testing circuit board as claimed in claim 7, wherein the plurality of sets of sockets include at least one set of a channel socket, which provides a signal channel while the tester is testing the device under test.

11. The testing circuit board as claimed in claim 7, wherein the plurality of sets of sockets include at least one set of a control socket, and the plurality of testing signals generated by the tester include a plurality of control signals, for at least one set of the control socket used for transferring the plurality of control signals to test the device under test.

12. The testing circuit board as claimed in claim 11, wherein at least one set of a controlling socket is a set of a relay control terminal socket.

13. The testing circuit board as claimed in claim 7, wherein the plurality of sets of sockets include at least one set of a control-bit test (CBIT) socket, and the plurality of testing signals include a plurality of CBIT testing signals, for at least one set of the CBIT sockets used for transferring the plurality of CBIT testing signals to proceed with a CBIT test to the device under test.

* * * * *